United States Patent [19]

Stopa

[11] Patent Number: 4,970,439
[45] Date of Patent: Nov. 13, 1990

[54] POWER SUPPLY CIRCUIT FOR A GASEOUS DISCHARGE TUBE DEVICE

[75] Inventor: James L. Stopa, Old Saybrook, Conn.

[73] Assignee: Minnesota Mining and Manufacturing Company, St. Paul, Minn.

[21] Appl. No.: 345,001

[22] Filed: Apr. 28, 1989

[51] Int. Cl.$^5$ ............................................. H05B 41/29
[52] U.S. Cl. ............................... 315/241 R; 315/224; 315/DIG. 7; 315/219
[58] Field of Search ............... 315/241 R, 241 P, 224, 315/DIG. 7, 242, 244, 245, 219, 200 A

[56] References Cited

U.S. PATENT DOCUMENTS 4,027,199  5/1977  Johnson ........................ 315/241 R
4,321,507  3/1982  Bosnak ......................... 315/241 R

*Primary Examiner*—Eugene R. LaRoche
*Assistant Examiner*—Ali Neyzari
*Attorney, Agent, or Firm*—Donald M. Sell; Walter N. Kirn; William B. Barte

[57] ABSTRACT

An improved power supply circuit for supplying power to intermittently energized loads, such as gaseous discharge tube devices. Such power supply has a transformer wherein current flow in the primary winding is controlled by a first semiconductor device that in turn is controlled by a second semiconductor device. A feedback circuit coupled to the primary winding provides a signal for turn-off of the first semiconductor device when its turn-off is initiated by the second semiconductor device. A circuit portion connected between the primary winding and the second semiconductor device provides a signal to the second semiconductor device when it initiates a turn-off of the first semiconductor device. Such signal continues operation of the second semiconductor device until the turn-off signal from the feedback circuit is effective to turn-off the first semiconductor device serving to reduce power dissipated in the first semiconductor device.

6 Claims, 1 Drawing Sheet

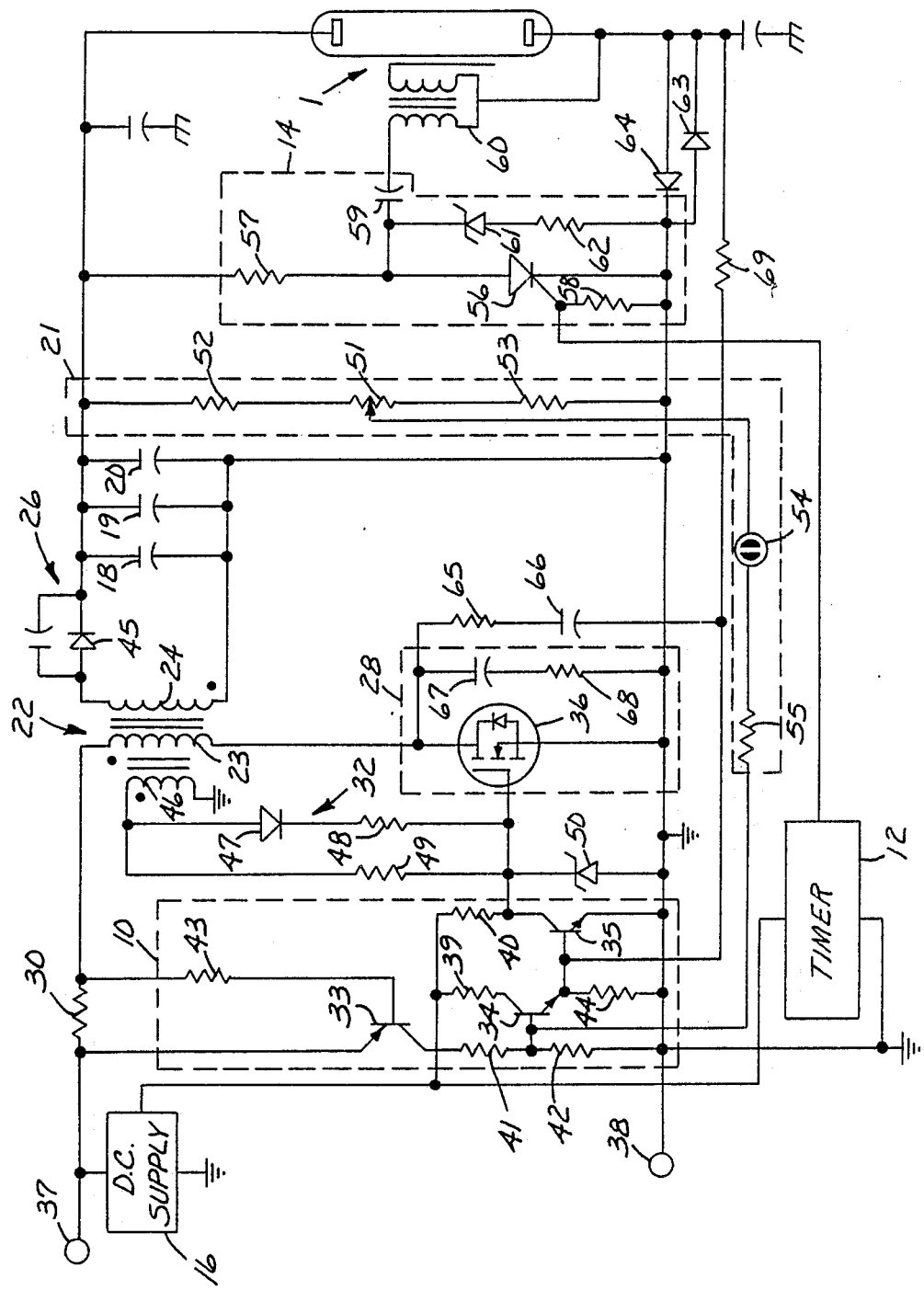

POWER SUPPLY CIRCUIT FOR A GASEOUS DISCHARGE TUBE DEVICE

FIELD OF THE INVENTION

The invention presented herein relates to power supplies for supplying power to intermittently energized loads such as gaseous discharge tube devices and more particularly to the improvement of the switching characteristics of such power supplies.

Description of the Prior Art

U.S. Pat. No. 4,321,507 to John J. Bosnak provides a solution to a number of deficiencies that existed with prior power supplies used with a gaseous discharge tube device that is repeatedly operated at a desired rate. One of the more significant deficiencies present in such prior power supplies is the high power consumption and the accompanying generation of a considerable amount of heat which had to be dissipated. It was recognized that this was due in part to the power switching characteristics, especially during "turn-off", of the semiconductor device used for the control of current through the primary winding of a static inverter transformer used in such power supplies. Current through the static inverter's power transformer was often controlled by a "power" semiconductor device which was turned off by being current starved rather than being controlled so as to switch off cleanly and sharply. Such current starvation mode of operation caused undesired heating of the semiconductor device. Though the patent to John J. Bosnak provides for positive switching to the nonconductive state of such a semiconductor device, it was desirable that the circuitry for switching of the device to the nonconductive state be improved to further reduce power dissipation in the device and increase inverter efficiency.

SUMMARY OF THE INVENTION

The invention presented herein provides an improvement applicable to prior known power supplies having control circuitry for switching a semiconductor device to the nonconductive state that is used in series with the primary winding of a transformer for a static inverter portion of the power supply wherein such power supply is useful for delivering electrical power to an intermittently energized load such as a gaseous discharge tube that is repeatedly operated at a desired rate. The improvement provided by the invention presented herein is embodied in a power supply circuit which includes a static inverter circuit portion having a transformer with a primary winding, a first semiconductor device in series with the primary winding for controlling current flow in the primary winding, a second semiconductor device connected to the first semiconductive device for controlling the operation of the first semiconductive device, and a feedback circuit including a winding coupled to the primary winding and connected to the first semiconductor device providing a signal for turn-off of the first semiconductor device following the initiation of the turn-off of the first semiconductor device by the second semiconductor device. The improvement includes a circuit portion connected between the primary winding of the transformer and the second semiconductive device for supplying a signal to the second semiconductor device when the second semiconductor device operates to initiate the turn-off of the first semiconductor. The signal provided such circuit portion continues such operation of the second semiconductor until the signal from the feedback circuit for turn-off of the first semiconductive device is effective, whereby the speed at which the first semiconductor device is turned-off is enhanced thereby reducing power dissipated in the first semiconductor device. Such circuit portion can be a series connected resistor and capacitor.

BRIEF DESCRIPTION OF THE DRAWING

The invention presented herein will be better understood and its advantages will become apparent to those skilled in the art from the following description considered in connection with the accompanying drawing which is an electrical circuit schematic diagram of an embodiment of a power supply in accordance with the invention.

DETAILED DESCRIPTION

The invention presented herein is embodied in the power supply of the drawing which is shown connected for control of the ionization of a gaseous discharge tube, such as a xenon flash tube indicated generally at 1. The major circuit portions of the power supply include a static inverter circuit portion, a control circuit portion indicated generally at 10, a trigger circuit portion 14, a timer 12 which delivers control pulses to the trigger circuit portion 14, a d.c. supply 16 for providing d.c. voltage at a level of use with some of the semiconductor devices of the circuitry, storage capacitors 18–20, a voltage level sensing circuit portion indicated generally at 21, a current sensing portion provided by a resistor 30 and a switching enhancing circuit portion indicated generally at 32. The static inverter circuit portion includes a transformer 22 having a primary winding 23 and a secondary winding 24, a rectifier portion 26 and a switch circuit portion indicated generally at 28 which is connected in series with the primary winding 23 for control of the current flow in the primary winding.

Referring to the control circuit portion 10, it includes three transistors 33–35 which are turned on or off dependent on signals presented in the power supply circuitry at various points and times. The conducting or non-conducting status of any one of the transistors 33–35 determines the conductive status for the transistor that follows it. Thus, when transistor 33 is off, transistors 34 and 35 will be off. Similarly, a turn off of transistor 34 causes transistor 35 to be turned off. Transistor 35, which is connected to the switch circuit portion 28, has an opposite effect on the semiconductor switching device 36 of such portion, since its conduction disables the device 36. As shown in the drawing, transistor 33 is a PNP type transistor while transistors 34 and 35 are NPN type transistors. The switch in device 36 can be a field effect transistor (FET) as shown in the drawing.

Operation of the power supply circuit of the drawing is initiated when a d.c. voltage is provided across the input terminals 37 and 38, wherein 38 is a circuit ground connection. This causes the d.c. supply 14 to be energized to provide an operating d.c. voltage to the timer 12, to the collector electrodes of transistors 34 and 35 via resistors 39 and 40, respectively, and via resistor 40, to the gate of the field effect transistor (FET), which is used as the semiconductor switching device 36 of the switch circuit portion 28. Conduction of transistor 33 occurs when the level of current flow through resistor 30 reaches the maximum level to be permitted, since transistor 33 has its emitter electrode connected to the input 37 end of resistor 30, its collector electrode connected to the input 38 via resistors 41 and 42 and its base electrode connected via a resistor 43 to the other end of resistor 30, which is also connected to one end of the primary winding 23. Since transistor 34 has its collector electrode connected to the d.c. supply 16 via resistor 39, its base electrode connected to the connection common to resistors 41 and 42 and its emitter electrode connected to circuit ground via a resistor 44, the conduction of transistor 34 requires the conduction of transistor 33. Similarly with the base electrode of transistor 35 connected to the emitter electrode of transistor 34, its emitter electrode connected to circuit ground and its collector electrode connected to the d.c. voltage supply 16 via resistor 40, the conduction of transistor 35 requires the conduction of transistor 34. With transistors 33–35 not conducting upon the application of d.c. voltage across terminals 37 and 38, the d.c. voltage from the d.c. supply 16 presented to the gate of FET 36 via the resistor 40 causes the FET to conduct current as a part of the circuit established by the resistor 30, the primary winding 23 and its connection to the drain electrode of FET 36 plus the connection of the source electrode of FET 36 to circuit ground.

The current so established through the primary winding 23 increases with time causing an increasing magnetic flux to be created by the primary winding to induce a voltage in the secondary winding 24 of transformer 22. The polarity of the voltages present at the primary and secondary winding is then positive at the dot connotation ends of the windings shown in the drawing. With the lower end of the secondary winding positive, no current flows via the diode 45 of the rectifier 26 since the anode of diode 45 is connected to the upper end of the secondary winding 24.

When the current level through resistor 30 reaches the maximum level to be permitted, transistor 33 becomes conductive causing transistor 34 to conduct which in turn causes transistor 35 to conduct to initiate the turn off of the FET 36 to terminate the current flow through the primary winding 23. The magnetic flux created by current flow through the primary winding begins to collapse causing the polarity of all of the transformer windings to reverse from that described above. Thus, the upper end of the secondary winding becomes positive with respect to the lower end causing current to flow in the secondary winding circuit which includes the diode 45 and the storage capacitors 18–20. A charging current is thus delivered to the capacitors 18–20 to partially charge the storage capacitors.

When current flow through the primary winding is initiated, a voltage is induced also in the winding 46 with its upper end being positive per the dot connotation shown in the drawing. While this condition exists the circuitry connected to the winding 46 is effective to provide a voltage at the gate of the FET 36 to effect its conduction along with the voltage provided from the power supply 16. The circuit components connected to respond to the voltage provided by the winding 46 include a series connected diode 47 and resistor 48 connected between the upper end of winding 46 and the gate of FET 36 and a resistor 49 connected in parallel with the diode-resistor series circuit. The anode of the diode 47 is connected to the winding 46. A Zener diode 50 is connected between circuit ground and the gate of FET 36 to provide protection as it limits the voltage level that can be applied to the gate of the FET 36.

Turning again to the situation wherein the transistor 35 becomes conductive to initiate the turn off of FET 36 and thereby terminate the flow of current through the primary winding 23, the resulting collapse of the magnetic flux that was created by the increasing current flow through the primary winding causes the winding 46 to present a negative instead of a positive voltage upper end thereby enhancing the speed at which the FET 36 is turned off.

The process described is repeated many times causing the voltage stored in the storage capacitors to rise. This voltage is monitored by the voltage sensing circuit portion 21 which includes potentiometer arrangement connected in parallel with the storage capacitors 28–30. The portion 21 includes potentiometer 51 and two series connected resistors 52 and 53 with the moveable contact of the potentiometer 51 being connected to base of transistor 34 via a neon bulb 54 connected in series with a resistor 55. With this arrangement the potentiometer is set to provide the voltage needed to trigger the neon bulb 54 when the voltage of the storage capacitors reach a desired voltage level for discharge via the xenon flash tube 1 when it is triggered. Conduction of the neon bulb 54 provides for current flow to the base of transistor 35 causing it to conduct and thereby initiate the turn off of the FET 36. The FET 36 remains off so long as the neon bulb 54 remains energized keeping the transistor 35 on. The neon bulb 54 will normally be turned off by operation of the tube 1 which will cause the capacitors 18–20 to be discharged to lower the voltage applied to the neon bulb.

As mentioned earlier, the application of power to the input terminals 37,38 will result in the application of a d.c. voltage to the timer 12 from the d.c. supply 16. Timers used for power supplies of type used with xenon flash tubes are well known. The timer 12 serves to provide signals to the trigger circuit portion 14 on a periodic basis. The trigger circuit portion includes a gated semiconductor switch device, such as a silicon controlled rectifier (SCR) 56, as shown in the drawing. The SCR 56 is connected in series with a resistor 57 across the storage capacitors 18–20. The gate of the SCR is connected to circuit ground via a resistor 58 and to the timer 12. The anode of the SCR is connected via a capacitor 59 to the primary winding of the trigger voltage transformer 60 of the tube 1. A series circuit formed from a Zener diode 61 and a resistor 62 is connected between the anode and cathode of the SCR and serves to protect the SCR from excessive voltage and determines the level to which the capacitor 59 is charged via resistor 57. With capacitor 59 charged, a signal from timer 12 will develop a voltage across resistor 58 and provide SCR gate trigger current to cause the SCR to conduct. Conduction of the SCR causes capacitor 59 to be discharged to circuit ground via the SCR, diode 63 and the primary winding of the trigger voltage transformer 60 and diode 63. Discharge of the capacitor 59 via the primary winding of transformer 60 causes a very high voltage to be induced across the secondary winding of the transformer which is effective to trigger the tube 1 into conduction. The tube 1 is connected across the storage capacitors 18–20 via the diode 64 so a path for rapid discharge of the capacitor 18–20 is established when the tube 1 is made conductive. The current passed by the tube 1 flows through the diode 64 creating a small voltage drop across diode 64. This voltage is applied to the base electrode of transistor 35 via resistor 69 causing it to be turned on. Turn on of transistor 35 initiates the turn off of the FET 36 to terminate the supply of power to the primary winding 23 of transformer 33 until the tube 1 de-ionizes to terminate the voltage drop across diode 64 for turn-off of the transistor 35 allowing FET 36 to again conduct.

Switching of the FET 36 to its nonconductive state using the circuitry described to this point leaves room for further reduction in the power dissipated in the FET 36. It has been found that the switching time of the FET 36 to its nonconductive state is reduced and thus reduces the power dissipated in the FET 36, by the use of the series circuit provided by resistor 65 and capacitor 66. This series circuit is connected between the source electrode of FET 36 and the base electrode of transistor 35. This series circuit serves to provide a signal to the base electrode of transistor 35, when turn-off of the FET 36 is initiated by conduction of the transistor 35, to keep the transistor 35 on until the turn-off signal supplied to the gate of the FET 36 by the winding 46 of transformer 22 is effective. Such series circuit operates in this manner since the voltage at the drain electrode of the FET 36 increases upon turn-off of the FET 36 and is supplied temporarily to the base electrode of transistor 35 via the resistor 65 and capacitor 66 series circuit for keeping the transistor 35 on. Without the series circuit provided by resistor 65 and capacitor 66, the action for turn-off of FET 36 may not be a continuous action since turn-off of the FET 36 causes a reduction in the current through resistor 30 resulting in the turn-off of transistor 33 which in turn causes transistor 35 to be turned off. Without a signal present at the base of the transistor 35, it would be turned off when transistor 34 is turned-off causing the FET 36 to be turned on if the signal from winding 46 for turn-off of the FET 36 is not effective at such time, i.e., due to the gate capacitance of the FET 36. Such action is eliminated by the use of the resistor 65 and capacitor 66 series circuit which assures that transistor 35 is on until such time as the signal from winding 46 is effective for turn-off of the FET 36.

The capacitor 67 and resistor 68, which are connected in series between the source and drain electrodes of FET 36, provide a snubber circuit for the FET 36 for control with the winding 23 of the maximum rate of change of voltage across the FET 36.

The particulars of the foregoing description are provided merely for purposes of illustration and are subject to a considerable latitude of modification without departing from the novel teachings disclosed therein. Accordingly, the scope of this invention is intended to be limited only as defined in the appended claims, which should be accorded a breadth of interpretation consistent with this specification.

I claim:

1. An improved power supply circuit which includes a transformer having a primary winding, a first semiconductor device in series with the primary winding for controlling current flow in the primary winding, a second semiconductor device connected to the first semiconductive device for controlling the operation of the first semiconductive device and a feedback circuit including a winding coupled to the primary winding and connected to the first semiconductor device providing a signal for turn-off of the first semiconductor device following the initiation of the turn-off of the first semiconductor device by the second semiconductor device, the improvement including:

a circuit portion connected between the primary winding of the transformer and the second semiconductive device for supplying a signal to the second semiconductor device when the second semiconductor device operates to initiate the turn-off of the first semiconductor device to continue such operation of the second semiconductor until the signal from the feedback circuit for turn-off of the first semiconductive device is effective, whereby the speed at which the first semiconductor device is turned-off is enhanced thereby reducing power dissipated in the first semiconductor device.

2. An improved power supply circuit according to claim 1 wherein said circuit portion includes a resistor connected in series with a capacitor.

3. An improved power supply circuit according to claim 1 wherein said second semiconductor device is a transistor having a base electrode with said circuit portion connected to said base electrode.

4. An improved power supply circuit according to claim 3 wherein said circuit portion includes a resistor connected in series with a capacitor.

5. An improved power supply circuit according to claim 1 wherein said first semiconductor device is a field effect transistor having a gate electrode, said second semiconductor device is a transistor having a base electrode and a collection electrode, said gate electrode connected to said collector electrode and said circuit portion connected to said base electrode.

6. An improved power supply circuit according to claim 5 wherein said circuit portion includes a resistor connected in series with a capacitor.

* * * * *